United States Patent [19]
Yasutake

[11] Patent Number: 5,142,145
[45] Date of Patent: Aug. 25, 1992

[54] COMPOSITE SCANNING TUNNELING MICROSCOPE

[75] Inventor: Masatoshi Yasutake, Tokyo, Japan

[73] Assignee: Seiko Instruments, Inc., Tokyo, Japan

[21] Appl. No.: 548,671

[22] Filed: Jul. 5, 1990

[30] Foreign Application Priority Data

Jul. 5, 1989 [JP] Japan .................. 1-74792

[51] Int. Cl.⁵ ........................... H01J 37/00
[52] U.S. Cl. ........................... 250/306; 250/442.1
[58] Field of Search ........... 250/306, 307, 423 F, 250/491.1, 442.1

[56] References Cited

U.S. PATENT DOCUMENTS

| | | | |
|---|---|---|---|
| 4,837,435 | 6/1989 | Sakuhara et al. | 250/306 |
| 4,866,271 | 9/1989 | Ono et al. | 250/442.1 |
| 4,874,945 | 10/1989 | Ohi | 250/306 |
| 4,914,293 | 4/1990 | Hayashi et al. | 350/507 |
| 4,999,495 | 3/1991 | Miyota et al. | 250/306 |

*Primary Examiner*—Bruce C. Anderson
*Attorney, Agent, or Firm*—Spensley Horn Jubas & Lubitz

[57] ABSTRACT

A composite apparatus including a scanning tunneling microscope linked to an optical microscope or electron microscope, wherein the focal length obtained while observing the surface of a sample with the optical or electron microscope or SEM sample is recorded, and, based on this length, the speed (hereinafter referred to as the Z crude drive) at which the gap between the STM needle and the sample approaches the tunneling region (approximately 10Å) is controlled and the calibration throughput is improved.

4 Claims, 2 Drawing Sheets

COMPOSITE SCANNING TUNNELING MICROSCOPE

BACKGROUND OF THE INVENTION

1. FIELD OF THE INVENTION

This invention relates to a scanning tunneling microscope.

In the operation of such a microscope, a stroke of about 5 mm is required for the Z-axis coarse drive in order to replace samples easily. On the other hand, a precision of 50 nm/step at most is required in order to convey the microscope needle to the tunneling region at about 2 mm from the sample surface. In the final step when the needle approaches the sample, the tunneling current is detected, the Z-axis coarse drive motor is stopped, and at the same time the precision drive element for the Z direction raises the needle to prevent the sample and needle from colliding. It follows that the operational speed of the precision drive element must be faster than the conveying speed of the Z-axis coarse drive motor. At present, in order to prevent the needle and sample from colliding, the Z-axis coarse drive speed has an upper limit which is set by conveying with a Z-axis coarse drive pulse motor at a repetition rate of less than 200 to 300 Hz. The following three strategies have conventionally been adopted as countermeasures to this:

2. Prior Art 1

While monitoring the space between the needle and sample with a stereomicroscope, the Z drive stage is conveyed at high speed until the needle comes in to close proximity with the sample and thereafter it is switched manually to a low speed.

3. Prior Art 2

On the first occasion, during the initial Z-axis coarse drive, all the conveyance is carried out at low speed and the number of pulses until arriving at the tunneling region are recorded. On the following occasions, the conveyance is carried out at high speed until arriving close to the sample, switching to low speed thereafter.

4. Prior Art 3

The sample is arranged in such a way that the top surface of the sample is held down in such a way that the distance between the needle and the sample is fixed even if the thickness of the sample varies (referred to as regulation of the top surface of the sample hereinbelow). Thus, the switching point between high speed and low speed in the Z-axis coarse drive can be fixed and does not depend upon the thickness of sample.

Prior art 1 makes it necessary to continually monitor the movement of the needle or sample. Further, with prior art 2, the Z-axis coarse drive takes time on the first occasion and, if the thickness of the sample frequently changes, movement has to be carried out at low speed to the same extent, and the throughput is 15 reduced. Moreover, while prior art 3 is acceptable for flat samples, there are problems in that it is difficult to apply when the sample is small and cannot be held down by the top surface of the holder or when there are large recesses and protrusions in the sample.

The present invention overcomes these disadvantages and aims to provide a composite tunneling microscope arranged in such a way that it moves the needle or the sample into the tunneling region by the distance from the STM needle to the sample surface on the basis of the focal length measured by an optical microscope or electron microscope.

SUMMARY OF THE INVENTION

This invention achieves the desired results by the provision of a composite apparatus including a scanning tunneling microscope and an optical microscope or electron microscope, the tunneling microscope including a Z-axis drive mechanism connected to a drive distance calculator which calculates the distance to the surface of a sample from the needle of the scanning tunneling microscope based on the focal length measured by the abovementioned optical microscope or electron microscope, and is equipped with a Z-axis drive mechanism controller which, based on the output from the calculator, calculates and controls the switching point at which the drive speed of the Z-axis drive mechanism is switched from high-speed drive to low-speed drive.

According to preferred embodiments of the invention the above-mentioned Z-axis drive mechanism is a Z-drive stage.

With this invention, the time taken to convey the needle to the tunneling region is shortened since the abovementioned Z-axis drive mechanism controller calculates the drive speed switching point and controls the Z-axis drive mechanism in such a way as to increase the high-speed driving distance as much as possible.

BRIEF DESCRIPTION OF THE DRAWINGS

FIGS. 1-4 are simplified side elevational views, in which:

FIG. 1 shows an embodiment of this invention;

FIG. 2 shows the Z-axis coarse drive for the Z drive stage of FIG. 1;

FIG. 3 shows another embodiment of the invention; and FIG. 4 shows a further embodiment of this invention.

DESCRIPTION OF THE PREFERRED EMBODIMENTS

A detailed explanation is now given using the example of a composite device with an optical microscope and a scanning tunneling microscope (STM). It is also possible to use the Z-axis coarse drive method to be described below in a composite device with a scanning electron microscope and a scanning tunneling microscope.

Figure 1:
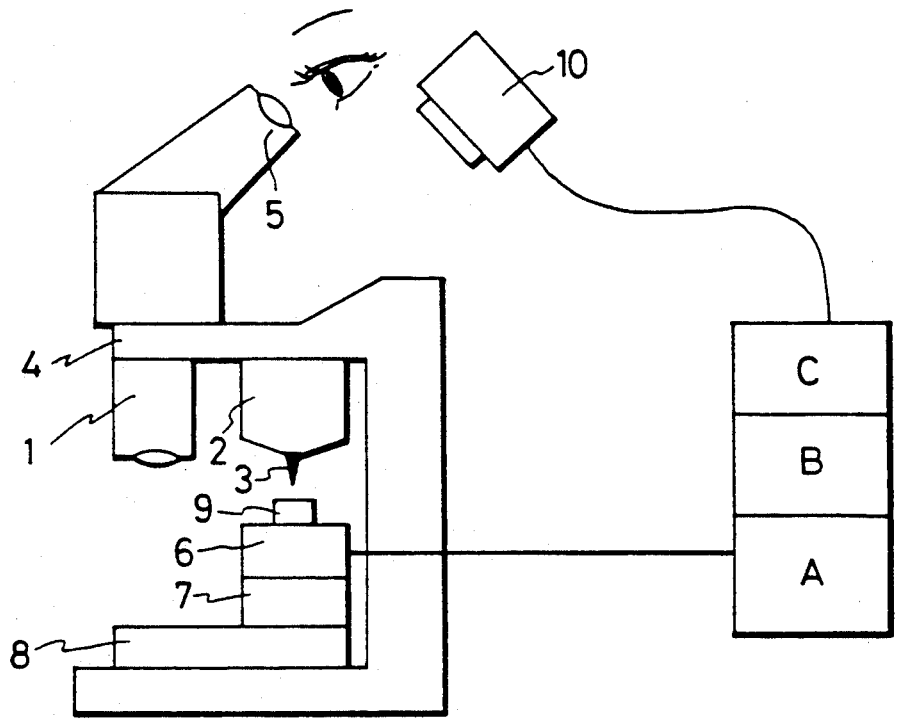

An embodiment is shown in FIG. 1. The objective lens 1 of an optical microscope and the precision drive elements 2 and 3 of a scanning tunneling microscope are supported in parallel on a support 4. Z-, Y- and X-axis drive mechanisms in the form of a Z-axis drive stage 6, a Y-axis drive stage 7 and an X-axis drive stage 8 are mounted on support 4 and a sample 9 is mounted on Z-axis drive stage 9. The optical microscope image is observed visually via an ocular 5 or it is electronically observed via a CCD camera 10.

The apparatus further includes a controller A for adjusting the speed of conveyance of Z stage 6, a calculator B for calculating the position coordinates of stage 6, and a focus control unit 6 for determining the focal point. Unit C may be omitted if a person ascertains the in-focus point and inputs the focal point to calculator.

Figure 2:
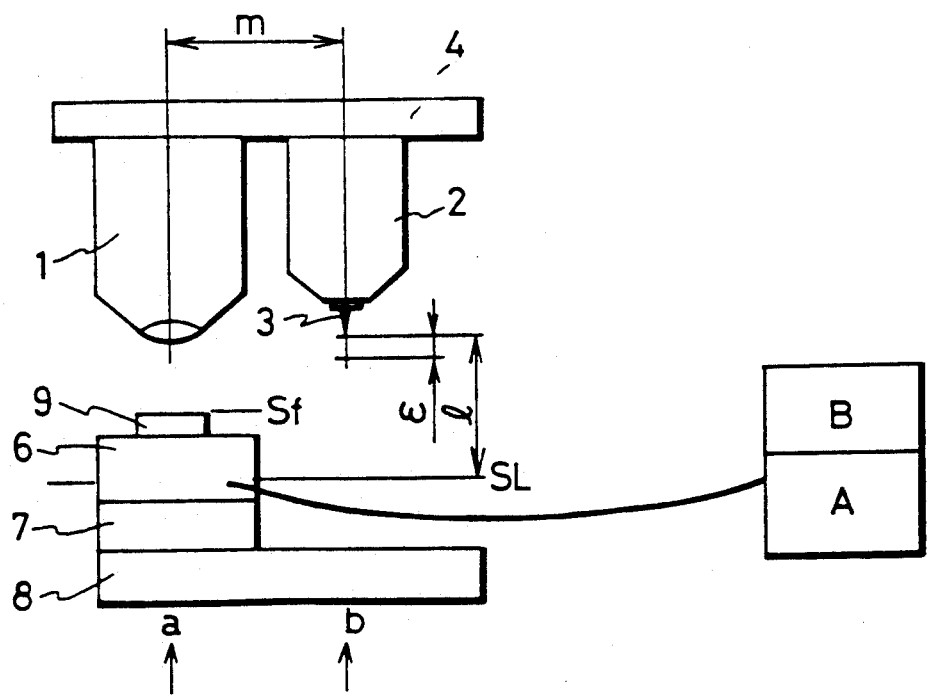

Operation of the apparatus will now be described. As shown in FIG. 2, the distance between the lower limit SL of stage 6 and the needle tip is designated 1. Initially, sample 9 is moved to the optical microscope position a by X stage 8. Following this, stage 6 is moved by Z stage controller A to seek the Z coordinate Sf where the top surface of sample 9 is in focus. This operation may be carried out manually, or may be carried out by a focal-point detector such as the unit C. When the top surface of sample 9 is in focus, the X and Y stages are moved to seek the sample observation point. After this, the X stage is moved by an amount m so that the sample is under the needle of the STM. The Z-axis coarse drive is then carried out. The drive distance calculator B is used to determine the distance over which the Z stage is to be driven at high speed from $1-(SL-Sf)-\epsilon$ [(the distance between the needle and the bottom limit of the stage 6) − (the distance between the focal plane and the bottom limit of stage 6) − (the low-speed drive distance $\epsilon$)], and Z-axis coarse drive operation is performed.

The method of determining the drive speed is now examined for a case in which the Z-axis stage is conveyed by a pulse motor. Let $l=5$ (mm), $Sf-SL=3$ (mm) (a sample thickness of 1 mm and a distance to the focal plane of z mm) and $\epsilon=0.1$ mm, the Z stage drive speed is taken as 50 nm/step with a low speed of 250 pps (pulses per second) and a high speed of $2 \times 10^3$ pps. It is possible to make the low speed drive time $100,000/(50 \times 250) = 8$ seconds and the high speed drive time $$\frac{2.9 \cdot 10^6}{50 \cdot 2 \cdot 10^3} = 29 \text{ seconds.}$$

It will be seen that conveying to the tunneling region is 7 to 8 times faster than in the prior art where, in the case of all the conveying being carried out at low speed as in prior art 2, the time is $$\frac{4 \cdot 10^6}{50 \cdot 250} = 320 \text{ seconds}$$

Figure 3:
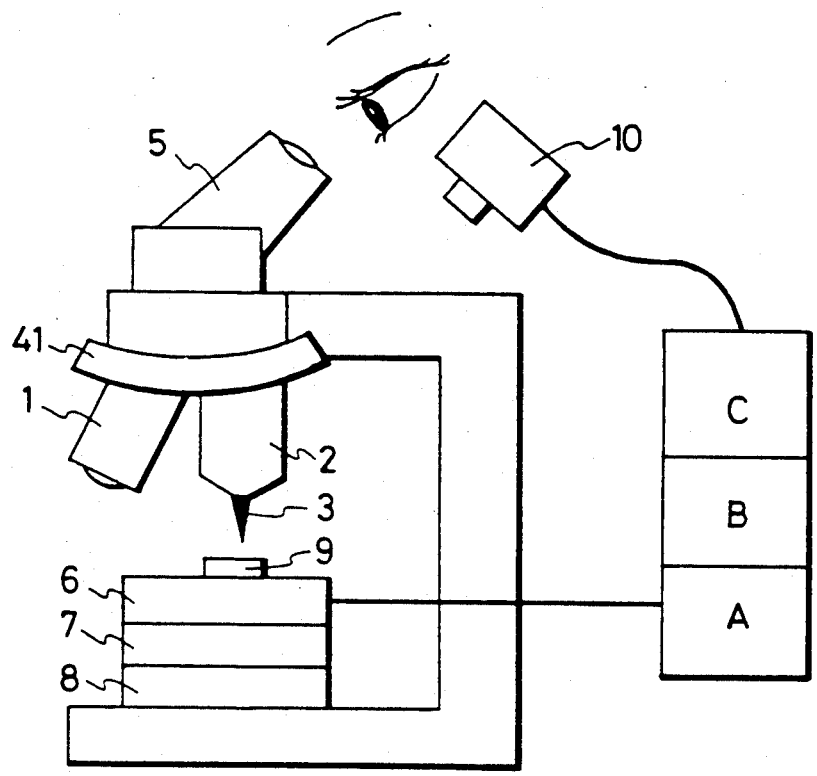
Figure 4:
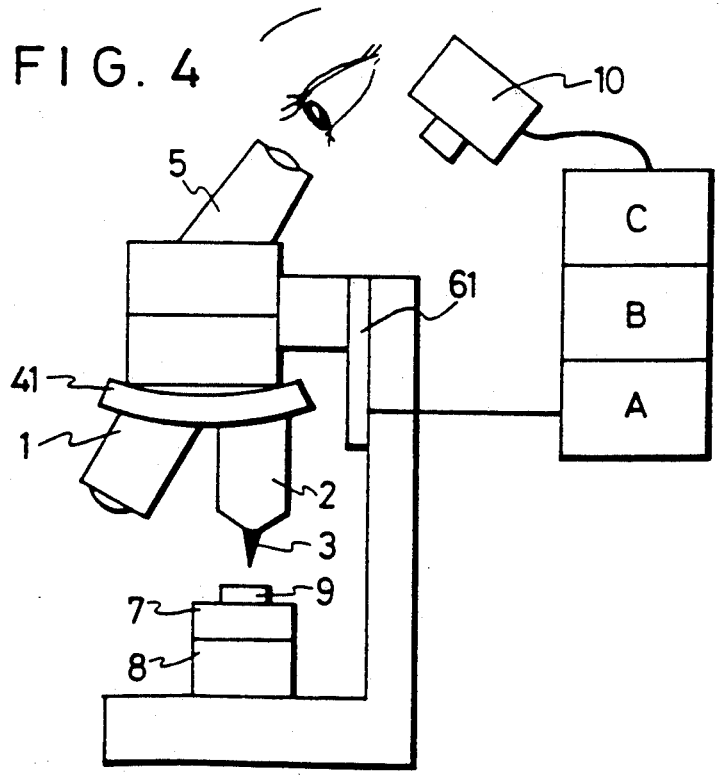

Other embodiments of the invention are shown in FIG. 3 and FIG. 4. FIG. 3 adopts a construction where switching between the object lens and the STM is not carried out by a linear movement of the X-stage as in FIG. 1, but the STM is incorporated into a turret 41 on the optical microscope and focusing is carried out using the Z drive stage 6. FIG. 4 has a construction in which the cylindrical microscope portion of the optical microscope is moved vertically instead of the Z drive stage. It is possible to exchange a plurality of object lenses if the STM is incorporated on a portion of the turret of the optical microscope.

In a device in which an optical microscope or an electron microscope have been combined with a scanning tunneling microscope, the calibrating throughput is improved and it is possible to convey the needle to the tunneling region in a short time without being affected by the shape of the sample by switching the Z-axis coarse drive speed on the basis of the focal length measured by the optical microscope.

What is claimed:

1. A composite observation apparatus comprising: a scanning tunneling microscope having a needle and arranged to carry out observations in an observation field having a longitudinal axis; a second microscope having a defined objective focal plane; sample holding means for holding a sample; drive means for effecting relative movement between said sample holding means and said tunneling microscope parallel to the longitudinal axis; drive distance calculating means connected to said drive means for calculating the distance, along the longitudinal axis, between said needle and the surface of a sample held by said sample holding means based on the sample surface position corresponding to the location of the defined objective focal plane of said second microscope; and drive control means connected to said calculating means and to said drive means for switching said drive means between high speed operation and low speed operation based on the distance calculated by said calculating means.

2. Apparatus as defined in claim 1 wherein said drive means is a Z-axis drive stage.

3. Apparatus as defined in claim 1 wherein said calculating means comprise means for determining the distance between the focal plane of said second microscope and a reference position of said sample holding means, and said calculating means control said drive control means for effecting high speed operation of said drive means until the surface of a sample held by said sample holding means comes to a predetermined distance from the needle.

4. Apparatus as defined in claim 3 wherein said drive means are operable for effecting relative movement between said sample holding means and said tunneling microscope parallel to the longitudinal axis selectively at a high speed which constitutes high speed operation or at a low speed which constitutes low speed operation, the low speed being lower than the high speed; and said calculating means further control said drive control means for effecting low speed operation of said drive means after the surface of a sample held by said sample holding means comes to the predetermined distance from the needle.

* * * * *